US010320398B2

(12) United States Patent
Jeon et al.

(10) Patent No.: US 10,320,398 B2
(45) Date of Patent: Jun. 11, 2019

(54) DELAY LOCKED LOOP TO CANCEL OFFSET AND MEMORY DEVICE INCLUDING THE SAME

(71) Applicant: Samsung Electronics Co., Ltd., Suwon-si, Gyeonggi-do (KR)

(72) Inventors: Juho Jeon, Bucheon-si (KR); Hun-Dae Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/697,885

(22) Filed: Sep. 7, 2017

(65) Prior Publication Data

US 2018/0123601 A1  May 3, 2018

(30) Foreign Application Priority Data

Oct. 27, 2016 (KR) .................. 10-2016-0141214

(51) Int. Cl.
| | |
|---|---|
| *H03L 7/081* | (2006.01) |
| *G11C 7/10* | (2006.01) |
| *G11C 7/22* | (2006.01) |
| *H03L 7/10* | (2006.01) |
| *G11C 29/02* | (2006.01) |
| *H03L 7/087* | (2006.01) |
| *H03L 7/197* | (2006.01) |
| *H03L 7/22* | (2006.01) |

(52) U.S. Cl.
CPC .......... *H03L 7/0814* (2013.01); *G11C 7/1066* (2013.01); *G11C 7/222* (2013.01); *G11C 29/023* (2013.01); *G11C 29/028* (2013.01); *H03L 7/087* (2013.01); *H03L 7/0812* (2013.01); *H03L 7/0818* (2013.01); *H03L 7/10* (2013.01); *H03L 7/197* (2013.01); *H03L 7/22* (2013.01)

(58) Field of Classification Search
CPC ..................................................... H03L 7/0814
See application file for complete search history.

(56) References Cited

U.S. PATENT DOCUMENTS

| | | | |
|---|---|---|---|
| 6,388,482 | B1 | 5/2002 | Schnell et al. |
| 7,253,668 | B2 | 8/2007 | Johnson |

(Continued)

FOREIGN PATENT DOCUMENTS

| | | |
|---|---|---|
| KP | 20140112663 A | 9/2014 |
| KR | 1020150063242 A | 6/2015 |

*Primary Examiner* — Daniel C Puentes
(74) *Attorney, Agent, or Firm* — Harness, Dickey & Pierce, P.L.C.

(57) ABSTRACT

A delay locked loop according to some example embodiments of the inventive concepts may include first, second, and third delay circuits, first and second phase detectors, and first and second controllers. The first delay circuit may generate a first clock by delaying a reference clock. The second and third delay circuits may be configured to generate a second and third clock respectively by delaying the first clock. The first and second phase detector may be configured to detect a phase difference between the second clock and the third clock and the third clock respectively. The first controller may be configured to adjust a delay of the third delay circuit using a detection result of the first phase detector. The second controller may be configured to adjust a delay of the first delay circuit using a detection result of the second phase detector.

14 Claims, 10 Drawing Sheets

(56) References Cited

U.S. PATENT DOCUMENTS

| | | |
|---|---|---|
| 7,471,130 B2 | 12/2008 | Gomm et al. |
| 8,296,598 B2 | 10/2012 | Roth et al. |
| 8,452,919 B2 | 5/2013 | Kim et al. |
| 8,917,128 B1 | 12/2014 | Baek et al. |
| 9,077,350 B2 | 7/2015 | Na et al. |
| 2007/0152723 A1 | 7/2007 | Ahn et al. |
| 2014/0062553 A1* | 3/2014 | Shim .................. H03L 7/08 327/158 |

* cited by examiner

DELAY LOCKED LOOP TO CANCEL OFFSET AND MEMORY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2016-014214, filed on Oct. 27, 2016, the entire contents of which are hereby incorporated by reference.

BACKGROUND

The inventive concepts relate to a delay locked loop and a memory device including the same, and more particularly, to a delay locked loop to cancel an offset and a memory device including the same.

When a clock applied from the outside is used inside an electronic device, a clock skew may occur in internal circuits. To compensate the clock skew, a delay locked loop (DLL) may be used. A delay locked loop (DLL) may be used for an electronic device to be synchronized with an external clock.

A general delay locked loop may include replica circuits that replicate internal circuits to synchronize an electronic device with an external clock. However, the internal circuits and the replica circuits may become different from one another due to process voltage temperature (PVT) variations. Because of this, there is a problem that an electronic device is not synchronized with a clock applied from the outside.

SUMMARY

Some example embodiments of the inventive concepts provide a delay locked loop. The delay locked loop includes first, second, and third delay circuits, first and second phase detectors, and first and second controllers. The first delay circuit is configured to generate a first clock by delaying a reference clock. The second delay circuit is configured to generate a second clock by delaying the first clock. The third delay circuit is configured to generate a third clock by delaying the first clock. The first phase detector is configured to detect a phase difference between the second clock and the third clock. The second phase detector may detect a phase difference between the reference clock and the third clock. The first controller may adjust a delay of the third delay circuit using a detection result of the first phase detector. The second controller may adjust a delay of the first delay circuit using a detection result of the second phase detector.

Some example embodiments of the inventive concepts provide a clock delay circuit and a delay locked loop. The clock delay circuit is configured to transmit a reference clock received from the outside to a data output circuit. The delay locked loop includes a variable delay circuit that is configured to generate a first clock by delaying the reference clock and a clock delay replica circuit that is configured to receive the first clock and replicates the clock delay circuit. The delay locked loop is configured to receive a second clock which is the delayed reference clock from the clock delay circuit, compare a third clock output from the clock delay replica to the second clock, and adjust a delay of the clock delay replica circuit based on a result of the comparison of the third clock and the second clock.

Some example embodiments of the inventive concepts provide a memory device including a variable delay circuit configured to output a first delayed clock signal based on a reference clock signal and a first delay code, a clock delay circuit configured to output a second delayed clock based on the first delayed clock, a data output circuit configured to output the data output signal based on the second delayed clock, a clock delay replica circuit configured to output a third delayed clock signal based on the first delayed clock signal and a second delay code, a data output replica circuit configured to output a data output replica signal based on the third delayed clock signal.

DETAILED DESCRIPTION OF THE EMBODIMENTS

Below, some example embodiments of the inventive concepts will be described more fully with reference to accompanying drawings to such an extent that one of an ordinary skill in the art may implement various aspects of the present disclosure.

Figure 1:
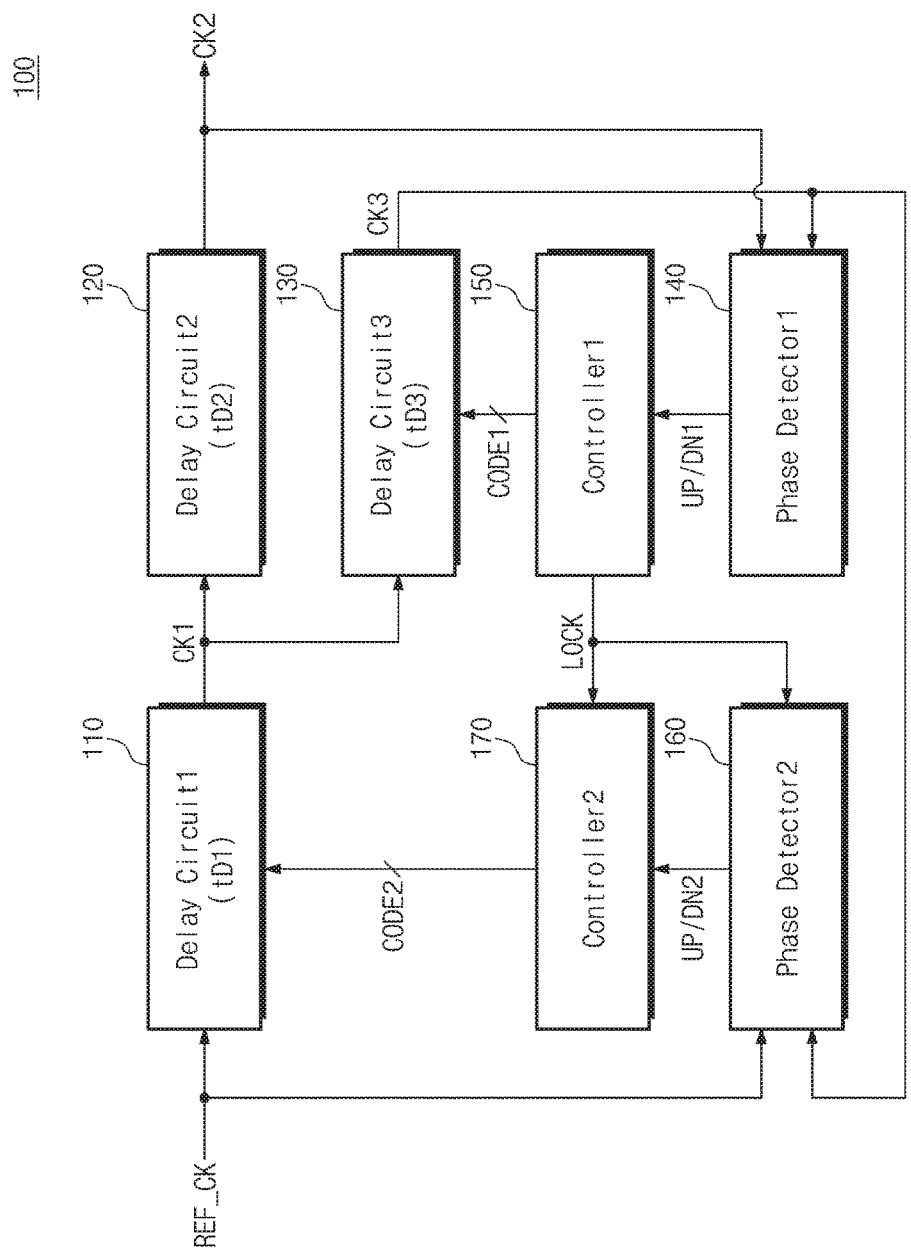
FIG. 1 is a block diagram illustrating a delay locked loop according to some example embodiments of the inventive concepts.

FIG. 1 is a block diagram illustrating a delay locked loop according to some example embodiments of the inventive concepts. Referring to FIG. 1, a delay locked loop 100 may include a first delay circuit 110, a second delay circuit 120, a third delay circuit 130, a first phase detector 140, a first controller 150, a second phase detector 160, and a second controller 170.

The first delay circuit 110 may receive a reference clock (REF_CK) and may delay the reference clock (REF_CK) by a time tD1. A first clock CK1 means the reference clock (REF_CK) delayed by the time tD1. The first delay circuit 110 may receive a second code CODE2 from the second controller 170. The time tD1 of the first delay circuit 110 may be adjusted by the second code CODE2. The first delay circuit 110 may be implemented by various logic circuits (e.g., INV, AND, NAND, OR, NOR, XOR, XNOR, etc.).

The second delay circuit 120 may receive the first clock CK1 and may delay the first clock CK1 by a time tD2. A second clock CK2 may be delayed by time tD2 more than the first clock CK1. That is, the second delay circuit 120 may perform the same function as the first delay circuit 110. The second clock CK2 may be output to the outside of the delay locked loop 100.

The time tD2 of the second delay circuit 120 may not be controlled by the delay locked loop 100. The delay locked loop according to some example embodiments of the inventive concepts may be applied to all electronic devices that perform an operation based on a clock. For example, the electronic devices may be a volatile memory (e.g., a DRAM (dynamic random access memory), a SRAM (static RAM), etc.) and a nonvolatile memory device (e.g., a NAND flash memory, a NOR flash memory, a FRAM (ferroelectric RAM), a PRAM (phase change RAM), a TRAM (thyristor RAM), a MRAM (magnetic RAM), etc.), a SSD (solid state drive), an ASIC (application specific integrated circuit), a FPGA (field programmable gate array), a SoC (system on chip), etc. An electronic device that operates based on a clock may output data, command, etc. synchronized with the clock to the outside. The second delay circuit 120 may include a route from an input pad to an output pad of the electronic device and internal circuits of the electronic device disposed on the route. In the electronic device, the input pad may receive a clock from the outside and the output pad may output data, command, etc. to the outside. A clock skew may occur due to the route and the internal circuits. The second delay circuit 120 may not be directly controlled by the delay locked loop 100.

The delay locked loop 100 may include the third delay circuit 130 to improve or remove the clock skew. The third delay circuit 130 may be a circuit that replicates the second delay circuit 120. That is, the third delay circuit 130 may be a modeling circuit of the second delay circuit. The third delay circuit 130 may receive the first clock CK1 and may delay the first clock CK1 by a time tD3. A third clock CK3 may be the delayed by the time tD3 than the first clock CK1. Ideally, the time tD3 is the same as the time tD2 and a phase of the third clock CK3 is the same as a phase of the second clock CK2. However, since the third delay circuit 130 is a circuit that replicates the second delay circuit 120, the time tD3 and the time tD2 may become different from each other due to PVT variations. That is, an offset may occur between the third clock CK3 and the second clock CK2.

The delay locked loop 100 may include the first phase detector 140 to remove the offset. The first phase detector 140 may receive the second clock CK2 and the third clock CK3 and may detect a phase difference between the second clock CK2 and the third clock CK3. For example, when a phase of the second clock CK2 is earlier than a phase of the third clock CK3, the first phase detector 140 may generate a first up signal UP1. On the contrary, when a phase of the second clock CK2 is later than a phase of the third clock CK3, the first phase detector 140 may generate a first down signal DN1.

The first controller 150 may adjust a delay of the third delay circuit 130 using a detection result of the first phase detector 140. More specifically, the first controller 150 may receive the first up/down signals (UP1/DN1). The first controller 150 may generate a first code CODE1 based on the first up/down signals (UP1/DN1). The time tD3 of the third delay circuit 130 may be adjusted by the first code CODE1. The first controller 150 can make the time tD3 of the third delay circuit 130 equal to the time tD2 of the second delay circuit 120 regardless of the PVT variations and then the offset may be removed.

In addition, the first controller 150 may include a digital loop filter (not shown) for stability of the delay locked loop 100. The digital loop filter may accumulate the first up/down signals (UP1/DN1). Although not illustrated, the first controller 150 may include an adder or a multiplier. An accumulation ratio of the digital loop filter may be determined with reference to time taken for the second clock CK2 to stabilize and the stability of the delay locked loop 100. If a phase of the third clock CK3 is locked to a phase of the second clock CK2, the first controller 150 may transmit a locking signal LOCK to the second phase detector 160 or the second controller 170. In the embodiment, in the case where the first controller 150 controls the third delay circuit 130 in a digital control manner, if the phase of the third clock CK3 is locked to the phase of the second clock CK2, a LSB (least significant bit) of the first code CODE1 may continuously toggle.

The second phase detector 160 may receive the reference clock (REF_CK) and the third clock CK3 and may detect a phase difference between the reference clock (REF_CK) and the third clock CK3. For example, when a phase of the reference clock (REF_CK) is earlier than a phase of the third clock CK3, the second phase detector 160 may generate a second up signal UP2. On the contrary, when the phase of the reference clock (REF_CK) is later than the phase of the third clock CK3, the second phase detector 160 may generate a second down signal DN2. The second phase detector 160 may be embodied the same as the first phase detector 140 only except an input signal.

The second controller 170 can adjust a delay of the first delay circuit 110 using a detection result of the second phase detector 160. The second controller 170 may perform mostly the same function as the first controller 150. The time tD1 of the first delay circuit 110 may be adjusted by the second code CODE2 generated by the second controller 170. In the embodiment, the second phase detector 160 or the second controller 170 may begin an operation after receiving the locking signal LOCK. In another embodiment, if the second clock CK2 is synchronized with the reference clock (REF_CK), the second controller 170 may output a synchronization signal.

The delay locked loop 100 can maintain constant a difference (tD1+tD2) between the reference clock (REF_CK) and the second clock CK2. In the embodiment, the difference (tD1+tD2) between the reference clock (REF_CK) and the second clock CK2 may become an integer multiple (n×tCK, n is an integer equal to or greater than 1) of a reference clock period tCK. As described above, since the delay locked loop 100 cannot directly control the time tD2 of the second delay circuit 120, the delay locked loop 100 may include the controllable first delay circuit 110 and may control the time tD1. Through those aforementioned things, the difference (tD1+tD2) between the reference clock (REF_CK) and the second clock CK2 may be maintained constant as the integer multiple (n×tCK) of the reference clock period time tCK.

The time tD3 of the third delay circuit 130 has to be equal to the time tD2 of the second delay circuit 120 to maintain constant the difference (tD1+tD2) between the reference clock (REF_CK) and the second clock CK2. As described above, an operation of the third delay circuit 130 may become different from an operation of the second delay circuit 120 due to PVT variations. Because of this, an offset may occur between the second clock CK2 and the third clock CK3. Due to the offset, a phase of the second clock CK2 may not be locked to a phase of the reference clock (REF_CK). However, according to the embodiment of the inventive concepts, the time tD3 of the third delay circuit 130 may become the same as the time tD2 of the second delay circuit 120 regardless of PVT variations.

Figure 2:
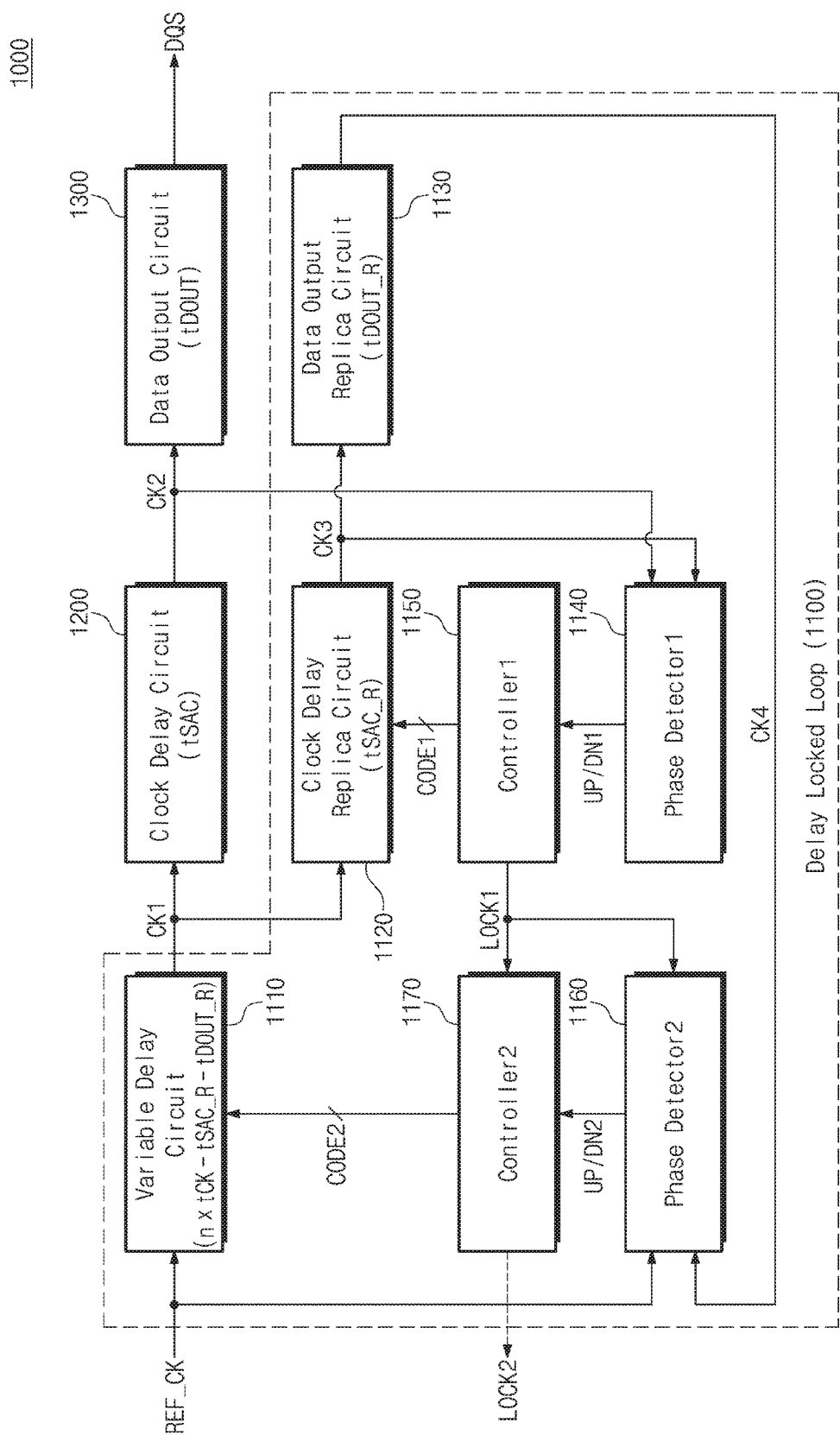
FIG. 2 is a block diagram illustrating a memory device according to some example embodiments of the inventive concepts.

FIG. 2 is a block diagram illustrating a memory device according to some example embodiments of the inventive concepts. Referring to FIG. 2, the memory device 1000 may include a delay locked loop 1100, a clock delay circuit 1200, and a data output circuit 1300. FIG. 2 will be described with reference to FIG. 1.

The delay locked loop 1100 may synchronize a data strobe DQS with a reference clock (REF_CK) received from the outside. The data strobe DQS (or a data output signal) may be a signal for sensing timing of write data being transmitted to the memory device 1000 or read data being output from the memory device 1000. The delay locked loop 1100 may receive the reference clock (REF_CK) and may transmit a first clock signal CK1 to the clock delay circuit 1200. The delay locked loop 1100 may perform mostly the same function as the delay locked loop 100 illustrated in FIG. 1.

The clock delay circuit 1200 may transmit the reference clock (REF_CK) received from the outside to the data output circuit 1300. More specifically, the clock delay circuit 1200 may receive the first clock CK1 and may transmit a second clock CK2 to the data output circuit 1300. The first clock CK1 is the delayed reference clock (REF_CK) and the second clock CK2 may be delayed by a time tSAC than the first clock CK1. The time tSAC may correspond to the time tD2 described in FIG. 1. The clock delay circuit 1200 may correspond to the second delay circuit 120 illustrated in FIG. 1 and may reflect a delay amount of actual clock path. The time tSAC of the clock delay circuit 1200 may not be controlled by the delay locked loop 1100.

The data output circuit 1300 may receive the second clock CK2 and may output the data strobe DQS to the outside based on the second clock CK2. The data strobe DQS may be delayed by a time tDOUT than second clock CK2 and may be output to the outside. The data output circuit 1300 may be internal circuits of the memory device 1000 located near a data output pad.

Referring to FIG. 2, the delay locked loop 1100 may include a variable delay circuit 1110, a clock delay replica circuit 1120, a data output replica circuit 1130, a first phase detector 1140, a first controller 1150, a second phase detector 1160, and a second controller 1170.

The variable delay circuit 1110 may receive the reference clock (REF_CK) and may delay the reference clock (REF_CK) by nxtCK−tSAC_R−tDOUT_R. The time tCK is a period of the reference clock (REF_CK) and the n represents a natural number. The time tSAC_R represents delay time by the clock delay replica circuit 1120 and the time tDOUT_R represents delay time by the data output replica circuit 1130. If delay time of the variable delay circuit 1110 is nxtCK−tSAC−tDOUT, the data strobe DQS may be the reference clock (REF_CK) delayed by nxtCK. That is, a phase of the data strobe DQS may be locked to a phase of the reference clock (REF_CK). The variable delay circuit 1110 may correspond to the first delay circuit 110 of FIG. 1.

The clock delay replica circuit 1120 may be a circuit where the clock delay circuit 1200 is replicated. That is, the clock delay replica circuit 1120 may be a modeling circuit of the clock delay circuit 1200. The clock delay replica circuit 1120 may receive the first clock CK1 and may delay the first clock CK1 by the time tSAC_R. A third clock CK3 is the first clock CK1 delayed by the time tSAC_R. The clock delay replica circuit 1120 may correspond to the third delay circuit 130 of FIG. 1.

The data output replica circuit 1130 may be a circuit where the data output circuit 1300 is replicated. That is, the data output replica circuit 1130 may be a modeling circuit of the data output circuit 1300. The data output replica circuit 1130 may receive the third clock CK3 and may delay the third clock CK3 by the time tDOUT_R. A fourth clock CK4 (or a data output replica signal) is the third clock CK3 delayed by the time tDOUT_R. When a phase of the fourth clock CK4 is locked to a phase of the data strobe DQS, the data strobe DQS may be synchronized with the reference clock (REF_CK).

The first phase detector 1140 may receive the second clock CK2 and the third clock CK3. The first phase detector 1140 may detect a phase difference between the second clock CK2 and the third clock CK3. The first phase detector 1140 may perform mostly the same function as the first phase detector 140 of FIG. 1.

The first controller 1150 may adjust a delay of the clock delay replica circuit 1120 using a detection result of the first phase detector 1140. That is, the delay locked loop 1100 may compare the third clock CK3 to the second clock CK2 to adjust a delay of the clock delay replica circuit 1120. The time tSAC_R of the clock delay replica circuit 1120 may be adjusted by a first code CODE1. The time tSAC_R of the clock delay replica circuit 1120 may become the same as the time tSAC of the clock delay circuit 1200 through the delay adjustments described above. Thus, an offset caused by a difference between the time tSAC of the clock delay circuit 1200 and the time tSAC_R of the clock delay replica circuit 1120 may not appear in the data strobe DQS. In the present embodiment, when a phase of the third clock CK3 is locked to a phase of the second clock CK2, the first controller 1150 may transmit a first locking signal LOCK1 to the second phase detector 1160 or the second controller 1170. The first controller 1150 may perform mostly the same function as the first controller 150 of FIG. 1.

The second phase detector 1160 may receive the reference clock (REF_CK) and the fourth clock CK4 and may detect a phase difference between the reference clock (REF_CK) and the fourth clock CK4. The second phase detector 1160 may perform mostly the same function as the second phase detector 160 of FIG. 1. In one embodiment, the second phase detector 1160 may be embodied the same as the first phase detector 1140 except input signals.

The second controller 1170 may adjust a delay of the variable delay circuit 1110 using a detection result of the second phase detector 1160. The nxtCK−tSAC_R−tDOUT_R of the variable delay circuit 1110 may be adjusted by a second code CODE2. In one embodiment, the second phase detector 1160 or the second controller 1170 may operate an operation after receiving the first locking signal LOCK1.

In another embodiment, the second controller 1170 may generate a second locking signal LOCK2. The second locking signal LOCK2 may be generated after a phase of the data strobe DQS is locked to a phase of the reference clock (REF_CK). The second locking signal LOCK2 may be transmitted to other internal circuits of the memory device 1000 not illustrated. For example, the data output circuit 1300 may synchronize read data with the data strobe DQS using the second locking signal LOCK2.

Figure 3:
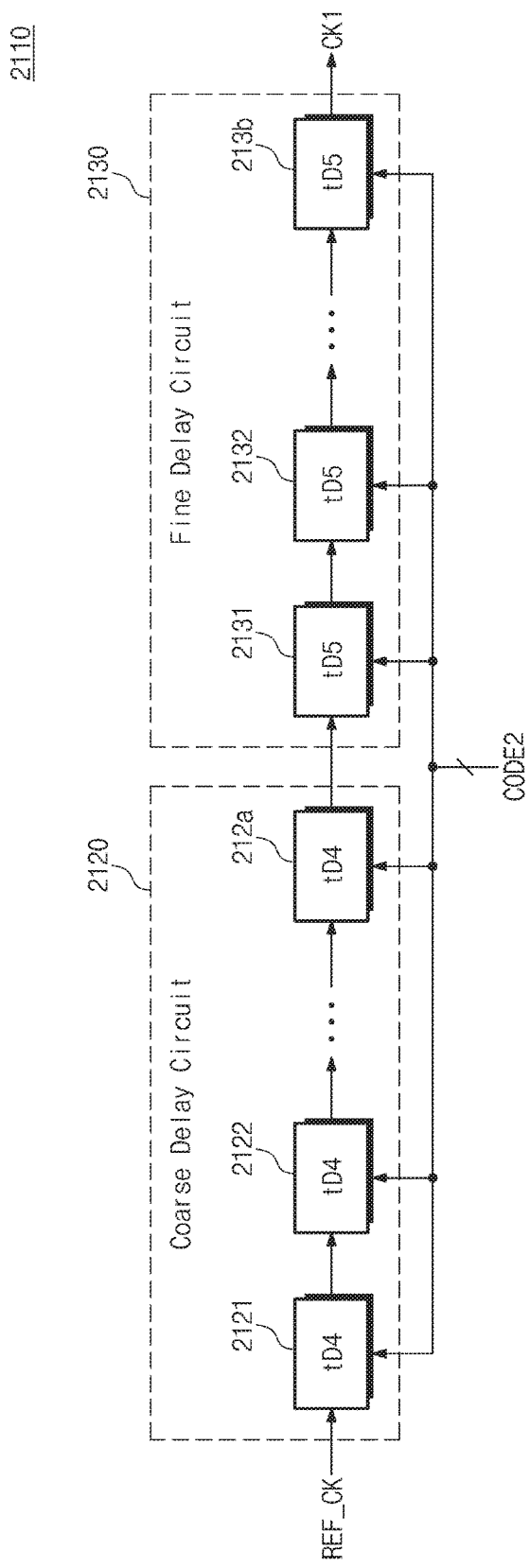
FIG. 3 is a block diagram illustrating a variable delay circuit illustrated in FIG. 2.

FIG. 3 is a block diagram illustrating a variable delay circuit illustrated in FIG. 2. Referring to FIG. 3, a variable delay circuit 2110 may include a coarse delay circuit 2120 and a fine delay circuit 2130. FIG. 3 will be described with reference to FIG. 2.

The coarse delay circuit 2120 may include first through ath delay units (2121 to 212*a*). The first through ath delay units (2121 to 212*a*) may be embodied the same as one another. Delay time of each of the first through ath delay units (2121 to 212a) may be time tD4. The coarse delay circuit 2120 may receive the reference clock (REF_CK) and may delay the reference clock (REF_CK) by arbitrary time from among 0 to a×tD4 according to the second code CODE2.

The fine delay circuit 2130 may include first through bth delay units (2131 to 213b). The first through bth delay units (2131 to 213b) may be embodied the same as one another. Delay time of each of the first through bth delay units (2131 to 213b) may be time tD5. The fine delay circuit 2130 may receive the delayed reference clock from the coarse delay circuit 2120 and may delay the received reference clock (REF_CK) by arbitrary time from among 0 to b×tD5 according to the second code CODE2. The fine delay circuit 2130 may output the first clock CK1. In the present embodiment, each of the first through ath delay units (2121 to 212a) and each of the first through bth delay units (2131 to 213b) may be implemented by various logical circuits (e.g., INV, AND, NAND, OR, NOR, XOR, XNOR, etc.).

The second code CODE2 may include a code that controls a delay of the coarse delay circuit 2120 and a code that controls a delay of the fine delay circuit 2130. To delay the reference clock (REF_CK) by the n×tCK−tSAC_R−tD-OUT_R described in FIG. 2, the second controller 1170 (refer to FIG. 2) may adjust a delay of the coarse delay circuit 2120 first. The second controller 1170 may rapidly delay the reference clock (REF_CK) near the n×tCK−tSAC_R−tDOUT_R through an adjustments of the coarse delay circuit 2120. After the adjustment of the coarse delay circuit 2120 is completed, the second controller 1170 may adjust a delay of the fine delay circuit 1230. The second controller 1170 may fine delay the reference clock (REF_CK) by the n×tCK−tSAC_R−tDOUT_R through an adjustments of the fine delay circuit 2130. More specifically, the time tD4 that is a delay unit of each of the first through ath delay units (2121 to 212a) may be the maximum delay time (b×tD5) of the fine delay circuit 2130.

The variable delay circuit 2110 illustrates a block diagram of the variable delay circuit 1110 illustrated in FIG. 2. However, the scope of the inventive concepts is not limited thereto and a method of setting arbitrary delay time using the coarse delay circuit and the fine delay circuit may be applied to the first and third delay circuits 110 and 130 illustrated in FIG. 1 and the clock delay replica circuit 1120 and the data output replica circuit 1130 that are illustrated in FIG. 2.

Figure 4:
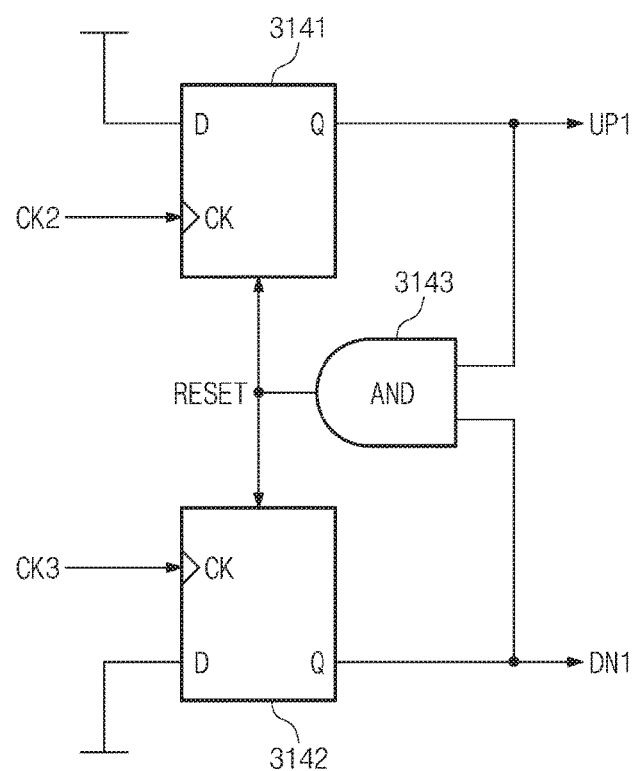
FIG. 4 is a block diagram illustrating a first phase detector illustrated in FIG. 2.

FIG. 4 is a block diagram illustrating a first phase detector illustrated in FIG. 2. FIG. 4 will be described with reference to FIG. 2. Referring to FIG. 4, a first phase detector 3140 may include a first flip-flop 3141, a second flip-flop 3142, and an AND logic 3143.

The first flip-flop 3141 may be synchronized with the second clock CK2. Similarly, the second flip-flop 3142 may be synchronized with the third clock CK3. A data input D of each of the first and second flip-flops 3141 and 3142 may be connected to an operation power supply. That is, the data input D may be connected to a logic "1". The first flip-flop 3141 may output an output Q as logic "1" at a rising edge of the second clock CK2. Similarly, the second first flip-flop 3142 may output an output Q as logic "1" at a rising edge of the third clock CK3. The output Q of the first flip-flop 3141 may become a first up signal UP1 and the output Q of the second flip-flop 3142 may become a first down signal DN1.

The AND logic 3143 performs an AND operation on the output Q of the first flip-flop 3141 and the output Q of the second flip-flop 3142 and may output a reset. The reset may be transmitted to the first and second flip-flops 3141 and 3142.

When a phase of the second clock CK2 is earlier than a phase of the third clock CK3, the first up signal UP1 may become logic "1" from the rising edge of the second clock CK2 and may become logic "0" from the rising edge of the third clock CK3. Similarly, when a phase of the third clock CK3 is earlier than a phase of the second clock CK2, the first down signal DN1 may become logic "1" from the rising edge of the third clock CK3 and may become logic "0" from the rising edge of the second clock CK2. That is, when a phase of the second clock CK2 is earlier than a phase of the third clock CK3, the first up signal UP1 may become logic "1" only in a section between from the rising edge of the second clock CK2 to the rising edge of the third clock CK3. When a phase of the third clock CK3 is earlier than a phase of the second clock CK2, the first down signal DN1 may become logic "1" only in a section between from the rising edge of the third clock CK3 to the rising edge of the second clock CK2.

Not only the phase detector 3140 illustrated in FIG. 4 but also all kinds of phase detectors that can compare phases of clocks may be applied to the delay locked loop according to some example embodiments of the inventive concepts. Each of the first and second phase detectors 140 and 160 illustrated in FIG. 1 and each of the first and second phase detectors 1140 and 1160 illustrated in FIG. 2 may be embodied to have the same structure except input clocks. A structure of the phase detector illustrated in FIG. 4 may be applied to not only the first and second phase detectors 140 and 160 illustrated in FIG. 1 but also the first and second phase detectors 1140 and 1160 illustrated in FIG. 2.

Figure 5:
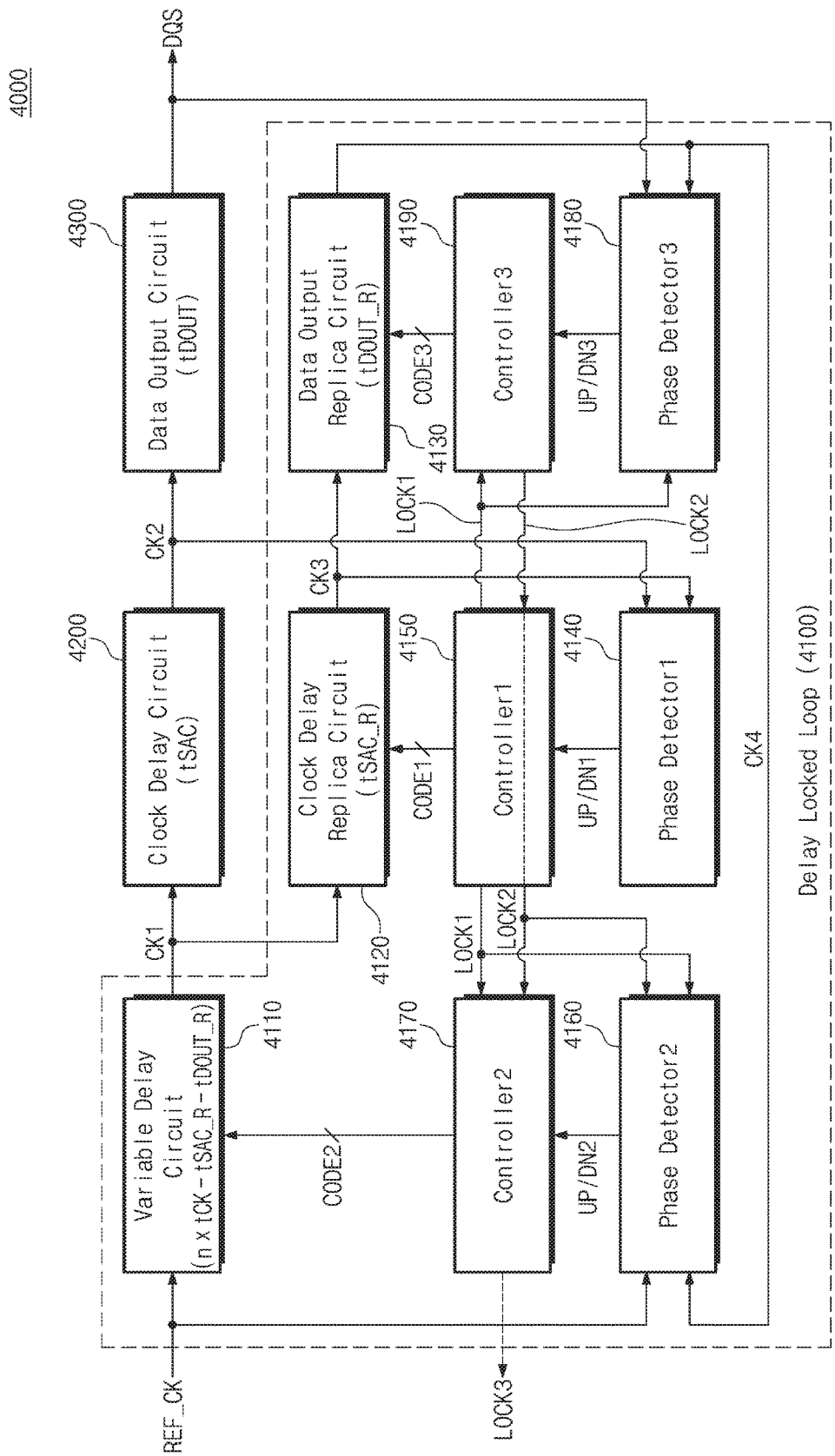
FIG. 5 is a block diagram illustrating a memory device according to some example embodiments of the inventive concepts.

FIG. 5 is a block diagram illustrating a memory device according to some example embodiments of the inventive concepts. Referring to FIG. 5, a memory device 4000 may include a delay locked loop 4100, a clock delay circuit 4200, and a data output circuit 4300. The delay locked loop 4100 may include a variable delay circuit 4110, a clock delay replica circuit 4120, a data output replica circuit 4130, a first phase detector 4140, a first controller 4150, a second phase detector 4160, a second controller 4170, a third phase detector 4180, and a third controller 4190. The variable delay circuit 4110, the clock delay replica circuit 4120, the data output replica circuit 4130, the first phase detector 4140, the first controller 4150, the second phase detector 4160, the second controller 4170, the clock delay circuit 4200, and the data output circuit 4300 may perform mostly the same function as those described in FIG. 2. The memory device 4000 may further include the third phase detector 4180 and the third controller 4190 as compared with the memory device 1000 illustrated in FIG. 2. FIG. 5 will be described with reference to FIG. 2.

The third phase detector 4180 may receive the fourth clock CK4 and the data strobe DQS and may detect a phase difference between the fourth clock CK4 and the data strobe DQS. For example, if a phase of the fourth clock CK4 is earlier than a phase of the data strobe DQS, the third phase detector 4180 may generate a third up signal UP3. On the contrary, if the phase of the fourth clock CK4 is later than the phase of the data strobe DQS, the third phase detector 4180 may generate a third down signal DN3.

The third controller 4190 may adjust a delay of the data output replica circuit 4130 using a detection result of the third phase detector 4180. The third controller 4190 may perform mostly the same function as the first and second controllers 4150 and 4170. A tDOUT_R of the data output replica circuit 4130 may be adjusted by a third code CODE3 generated by the third controller 4190.

The third phase detector 4180 or the third controller 4190 may begin an operation after receiving a first locking signal LOCK1. If a phase of the fourth clock CK4 is locked to a phase of the data strobe DQS, the third controller 4190 may transmit a second locking signal LOCK2 to the second phase detector 4160 or the second controller 4170. That is, the first controller 4150, the third controller 4190, and the second controller 4170 may sequentially operate. The first controller 4150 and the third controller 4190 may sequentially operate, may operate in reverse, or may operate at the same time. The second controller 4170 may operate an operation after the time tSAC_R and time tDOUT_R are accurately adjusted.

In another embodiment, if a phase of the data strobe DQS is locked to a phase of the reference clock (REF_CK), the second controller 4170 may generate a third locking signal LOCK3 with reference to the first locking signal LOCK1 and the second locking signal LOCK2. The memory device 4000 may synchronize read data with the data strobe DQS using the third locking signal LOCK3.

The memory device 4000 may further include the third phase detector 4180 and the third controller 4190 as compared with the memory device 1000 illustrated in FIG. 2. Thus, the memory device 4000 can remove an offset between the time tDOUT of the data output circuit 4300 and an offset of the time tDOUT_R of the data output replica circuit 4130.

Figure 6:
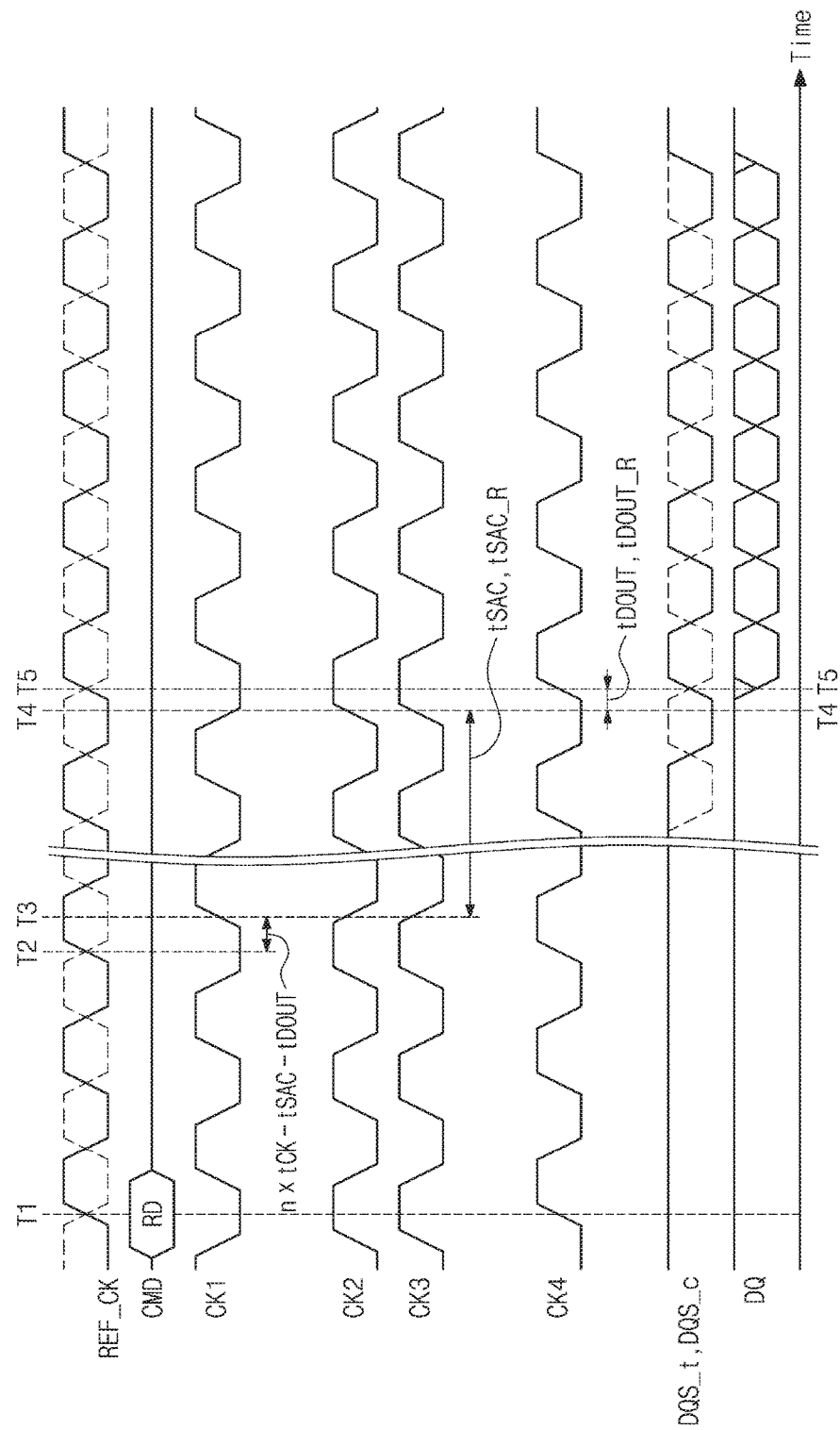
FIGS. 6 through 8 are timing diagrams illustrating an operation of the memory device illustrated in FIG. 5.
Figure 7:
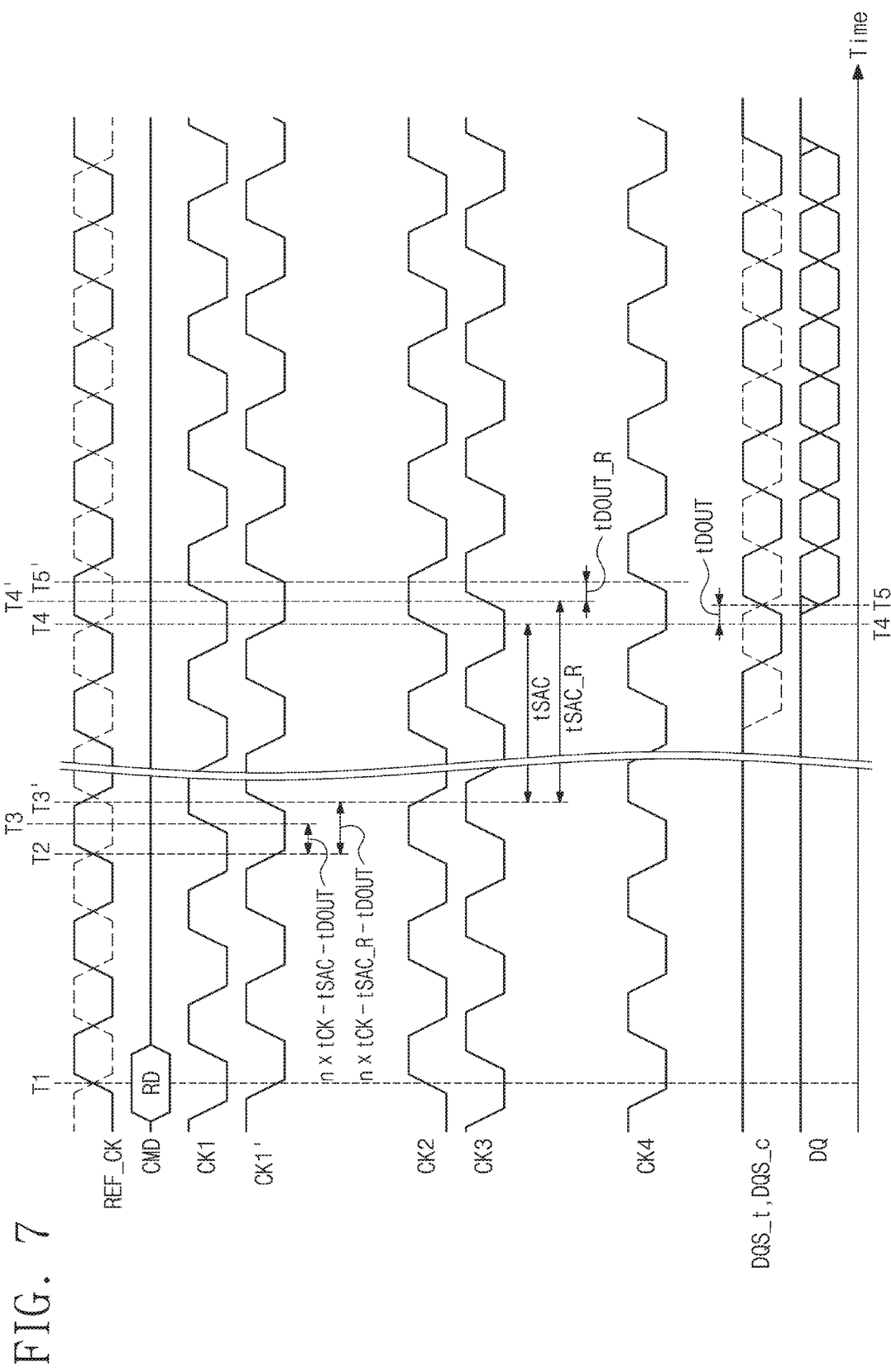
Figure 8:
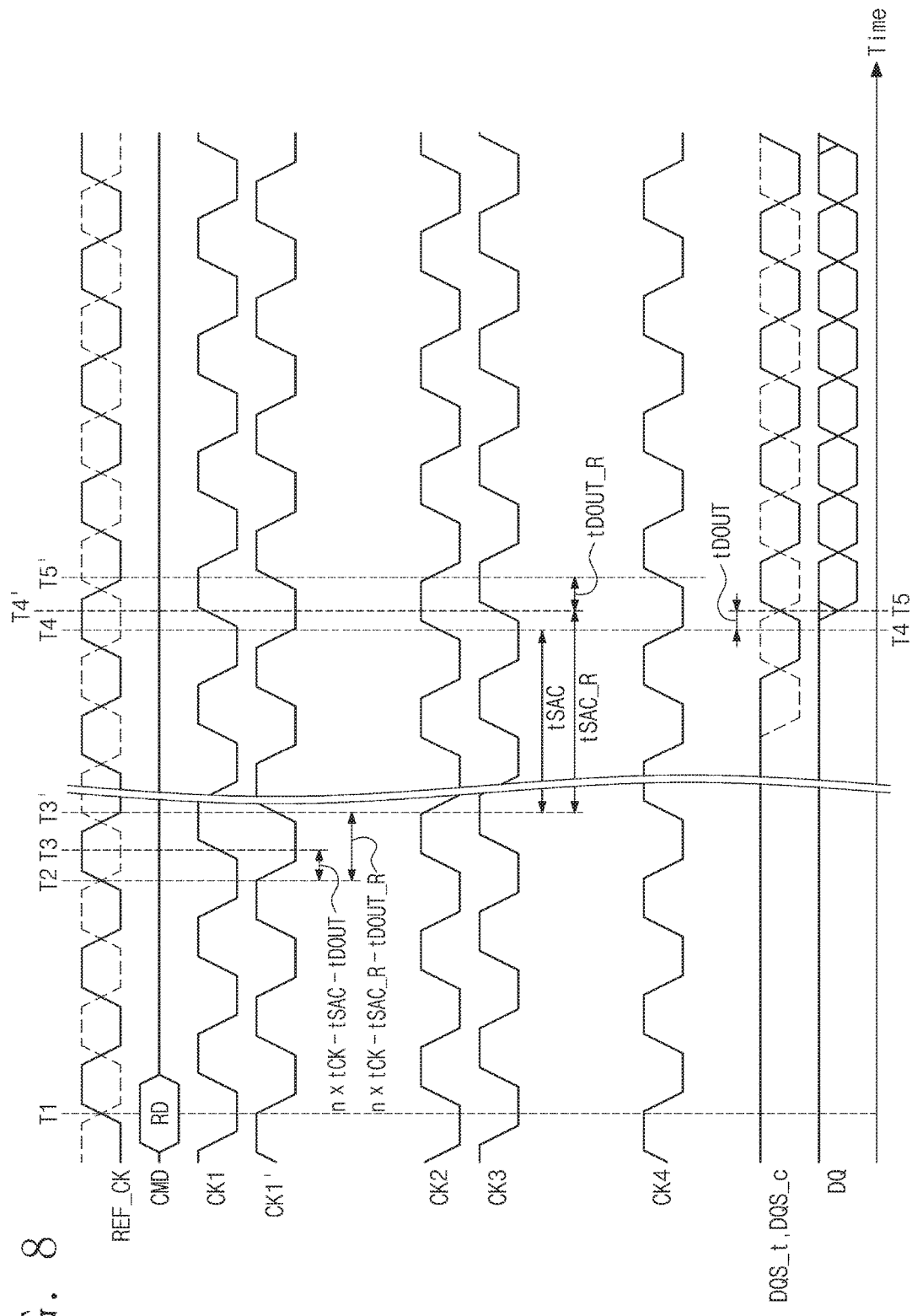

FIGS. 6 through 8 are timing diagrams illustrating an operation of the memory device illustrated in FIG. 5. FIGS. 6 through 8 will be described with reference to FIG. 5. It is assumed that a burst length of the memory device 4000 is 8 in FIGS. 6 through 8. Here, the burst length may be the number of data bits output from a data pad according to a read command.

Referring to FIGS. 6 through 8, at time T1, the memory device 4000 may receive a read command RD. The read command RD synchronizing with a rising edge of the reference clock (REF_CK) may be transmitted to the memory device 4000. A clock (illustrated by a dotted line) having a phase opposite to the reference clock (REF_CK) may be transmitted to the memory device 4000 together with the reference clock (REF_CK). After the time T1, the memory device 4000 may perform an operation to output read data after receiving the read command RD.

FIG. 6 illustrates a case where the time tSAC_R of the clock delay replica circuit 4120 is equal to the time tSAC of the clock delay circuit 4200 and the time tDOUT_R of the data output replica circuit 4130 is equal to the time tDOUT of the data output circuit 4300. FIG. 7 illustrates a case where the time tSAC_R of the clock delay replica circuit 4120 is not equal to the time tSAC of the clock delay circuit 4200 and the time tDOUT_R of the data output replica circuit 4130 is equal to the time tDOUT of the data output circuit 4300. FIG. 8 illustrates a case where the time tSAC_R of the clock delay replica circuit 4120 is not equal to the time tSAC of the clock delay circuit 4200 and the time tDOUT_R of the data output replica circuit 4130 is not equal to the time tDOUT of the data output circuit 4300.

Referring to FIG. 6, at time T2, the first clock CK1 may be delayed by nxtCK–tSAC–tDOUT by the variable delay circuit 4110 with respect to the reference clock (REF_CK). The time T2 is shown at arbitrary rising edge of the reference clock (REF_CK) to illustrate that the reference clock (REF_CK) is delayed. A interval between the time T2 and time T3 represents the nxtCK–tSAC–tDOUT. Even if a delay of the variable delay circuit 4110 illustrated in FIG. 5 is nxtCK–tSAC_R–Tdout_R, since the time tSAC_R is coincident with the time tSAC and the time tDOUT_R is coincident with the time tDOUT, the first clock CK1 may be delayed by the nxtCK–tSAC–tDOUT with respect to the reference clock (REF_CK). The clock delay circuit 4200 may receive a first clock CK1 and may generate a second clock CK2 delayed by the time tSAC than the first clock CK1. The clock delay replica circuit 4120 may receive the first clock CK1 and may generate a third clock CK3 delayed the by time tSAC_R than the first clock CK1.

At time T4, since the time tSAC_R is coincident with the time tSAC, a phase of the third clock CK3 may be locked to a phase of the second clock CK2. The time T4 is shown at an arbitrary rising edge of the second clock CK2 and the third clock CK3 to illustrate that the phase of the third clock CK3 is locked to the phase of the second clock CK2. As before described, the data output circuit 4300 may delay the second clock CK2 by the time tDOUT and may generate the data strobe DQS. The data output replica circuit 4130 may receive the third clock CK3 and may generate a fourth clock CK4 delayed by the time tDOUT_R than the third clock CK3.

At time T5, since the time tDOUT_R is coincident with the time tDOUT, a phase of the fourth clock CK4 may be locked to a phase of the data strobe DQS. An interval between from the time T1 to the time T5 may be read latency (time needed for read data to be output after a read command). At the time T5, the phase of the data strobe DQS may be locked to a phase of the reference clock (REF_CK). In addition, the data strobe DQS may be output in a differential manner. That is, the memory device 4000 may output data strobes (DQS_t, DQS_c). Before data is output through a data pad, the data strobes (DQS_t, DQS_c) may perform a preamble operation.

According to some example embodiments of the inventive concepts, the delay locked loop 4100 may adjust the time tSAC_R and the time tDOUT_R to be equal to the time tSAC and time tDOUT respectively and the fourth clock CK4 having the same phase as the data strobe DQS may be fed back to the delay locked loop 4100. Thus, the delay locked loop 4100 may synchronize the data strobe DQS with the reference clock (REF_CK) by synchronizing the fourth clock CK4 with the reference clock (REF_CK). In FIG. 7, a case where the time tSAC_R is not coincident with the time tSAC will be described.

Referring to FIG. 7, at the time T2, the first clock CK1 (an ideal case of FIG. 6) may be delayed by nxtCK–tSAC–tDOUT by the variable delay circuit 4110 with respect to the reference clock (REF_CK) and a first offset clock CK1' (an offset case) may be delayed by nxtCK–tSAC_R–tDOUT by the variable delay circuit 4110 with respect to the reference clock (REF_CK). A rising edge of the first offset clock CK1' may be formed at time T3' while a rising edge of the first clock CK1 is formed at the time T3. An interval between the time T2 and the time T3 may represent the nxtCK–tSAC–tDOUT and an interval between the time T2 and the time T3' may represent nxtCK–tSAC_R–tDOUT. The clock delay circuit 4200 and the clock delay replica circuit 4120 may receive the first offset clock CK1'.

At the time T4, since the time tSAC_R is not coincident with the time tSAC, a phase of the third clock CK3 is not locked to a phase of the second clock CK2. A rising edge of the third clock CK3 may be formed at time T4' while a rising edge of the second clock CK2 is formed at the time T4. That is, since a difference between the time tSAC and the time tSAC_R, the phase of the third clock CK3 may not be locked to the phase of the second clock CK2.

A rising edge of the data strobe DQS may be formed at the time T5. A rising edge of the fourth clock CK4 may be formed at time T5'. Since a difference between the time tSAC and the time tSAC_R, the fourth clock CK4 may not have the same phase as the data strobe DQS. In the case where the delay locked loop 4100 adjusts a delay of the variable delay circuit 4110 using the fourth clock CK4, the delay locked loop 4100 cannot synchronize the data strobe DQS with the reference clock (REF_CK). However, according to some example embodiments of the inventive concepts, an offset between the second clock CK2 and the third clock CK3 may be removed as illustrated in FIG. 6. In FIG. 8, a case where the time tSAC_R is not coincident with the time tSAC and the time tDOUT_R is not coincident with the time tDOUT will be described.

Referring to FIG. 8, at the time T2, the first clock CK1 (an ideal case of FIG. 6) may be delayed by n×tCK−tSAC−tDOUT by the variable delay circuit 4110 with respect to the reference clock (REF_CK) and a first offset clock CK1' (an offset case) may be delayed by n×tCK−tSAC_R−tDOUT_R by the variable delay circuit 4110 with respect to the reference clock (REF_CK). A rising edge of the first offset clock CK1' may be formed at the time T3' while a rising edge of the first clock CK1 is formed at the time T3. An interval between the time T2 and the time T3 may represent n×tCK−tSAC−tDOUT and an interval between the time T2 and the time T3' may represent n×tCK−tSAC_R−tDOUT_R. The time T3' of FIG. 8 may be further delayed as compared with the time T3' of FIG. 7 because of a difference between the time tDOUT and the time tDOUT_R.

Since at the time T4, the time tSAC_R is not coincident with the time tSAC and the time tDOUT_R is not coincident with the time tDOUT, a phase of the third clock CK3 is not locked to a phase of the second clock CK2. A rising edge of the third clock CK3 may be formed at time T4' while a rising edge of the second clock CK2 is formed at the time T4. That is, a phase of the third clock CK3 may not be locked to a phase of the second clock CK2 because of a difference between the time tSAC and the time tSAC_R and a difference between the time tDOUT and the time tDOUT_R.

A rising edge of the data strobe DQS may be formed at the time T5. A rising edge of the fourth clock CK4 may be formed at time T5'. The fourth clock CK4 may not have the same phase as the data strobe DQS because of the difference between the time tSAC and the time tSAC_R and the difference between the time tDOUT and the time tDOUT_R. In the case where the delay locked circuit 4100 adjusts a delay of the variable delay circuit 4110 using the fourth clock CK4, the delay locked loop 4100 cannot synchronize the data strobe DQS with the reference clock (REF_CK). If the time tSAC_R is not coincident with the time tSAC and the time tDOUT_R is not coincident with the time tDOUT, a time tDQSCK (a skew between the data strobe DQS and the reference clock (REF_CK)) may gradually increase. Because of this, a tDV (data valid window) may be reduced. However, according to some example embodiments of the inventive concepts, an offset between the second clock CK2 and the third clock CK3 and an offset between the data strobe DQS and the fourth clock CK4 may be removed as illustrated in FIG. 6. Thus, the time tDQSCK and the time tDV may be improved by the embodiments of the present inventive concepts.

Figure 9:
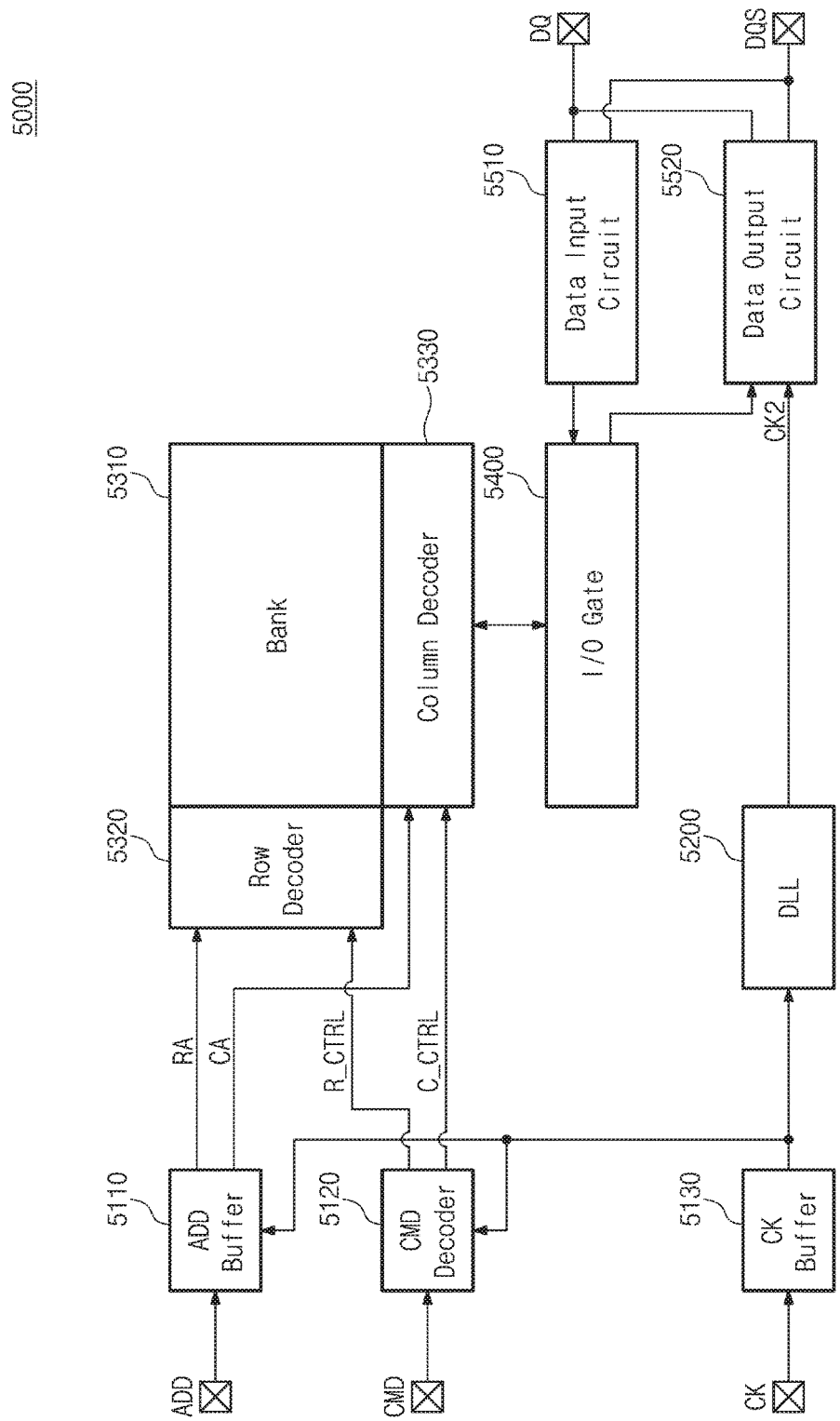
FIG. 9 is a block diagram illustrating a memory device including a delay locked loop according to some example embodiments of the inventive concepts.

FIG. 9 is a block diagram illustrating a memory device including a delay locked loop according to some example embodiments of the inventive concepts. Referring to FIG. 9, a memory device 5000 may include an address buffer 5110, a command decoder 5120, a clock buffer 5130, a delay locked loop 5200, a bank 5310, a row decoder 5320, a column decoder 5330, an input/output gate 5400, a data input circuit 5510, and a data output circuit 5520.

The address buffer 5110 may receive an address ADD from the outside through an address pad. The address buffer 5110 being synchronized with a clock output from the clock buffer 5130 may operate. The address buffer 5110 may transmit a row address RA and a column address CA to the row decoder 5320 and the column decoder 5330 respectively.

The command decoder 5120 may receive various commands CMD from the outside through a command pad. The command decoder 5120 being synchronized with a clock output from the clock buffer 5130 may operate. The command CMD may include an activate command ACT, a read command RD, or a write command WR. The command decoder 5120 can decode a write enable signal WE, a row address strobe signal RAS, a column address strobe signal CAS, an activation signal ACT, a chip select signal CS, an address signal transmitted from the address buffer 5110, etc. The command decoder 5120 may decode the command CMD and may generate a row decoder control signal (R_CTRL) and a column decoder control signal (C_CTRL).

The clock buffer 5130 may receive a reference clock (REF_CK) through a clock pad. The clock buffer 5130 may transmit the received reference clock (REF_CK) to the internal circuits of the memory device 5000 illustrated in FIG. 9 and internal circuits not illustrated in FIG. 9.

The delay locked loop 5200 can compensate a delay (tSAC+tDOUT) that necessarily occurs until the reference clock (REF_CK) is output to the data strobe DQS. Since the delay locked loop 5200 can accurately replicate the time tSAC and the time tDOUT, the time tDQSCK and the time tDV may be improved. Referring to FIG. 9, the delay locked loop 5200 may receive the reference clock (REF_CK) through the clock buffer 5130. In this case, a delay of the clock buffer 5130 may be included in the time tSAC described in FIGS. 2 through 8.

The bank 5310 may be considered as a memory cell array. For brevity of drawing, only one bank 5310 is illustrated but the memory device 5000 may include a plurality of banks. A size of the banks 5310 or the number of banks may be determined by a protocol or a specification. The bank 5310 may be controlled by the row decoder 5320 and the column decoder 5330.

The row decoder 5320 may activate a word line WL (not shown) in response to the row address RA and the row decoder control signal (R_CTRL). More specifically, when the memory device 5000 receives an activation command from the outside, the row decoder 5320 can select an arbitrary word line.

The column decoder 5330 can activate a bit line BL (not shown) in response to the column address CA and the column decoder control signal (C_CTRL). More specifically, when the memory device 5000 receives a read command or a write command from the outside, the column decoder 5330 can select an arbitrary bit line that crosses the word line selected in advance.

The input/output gate 5400 can write data in a memory cell disposed at a point where the selected word line and the selected bit line cross each other. In this case, the input/output gate 5400 may receive write data from the data input circuit 5510. The input/output gate 5400 may read data from a memory cell disposed at a point where the selected word line and the selected bit line cross each other. In this case, the input/output gate 5400 may transmit read data to the data output circuit 5520.

The data input circuit 5510 may transmit write data received through a data pad to the input/output gate 5400. At this time, the data input circuit 5510 may also receive data strobe DQS through a data strobe pad.

The data output circuit 5520 may output read data through the data pad. The data output circuit 5520 may receive the read data from the input/output gate 5400. At this time, the data output circuit 5520 may output the data strobe DQS through the data strobe pad.

Figure 10:
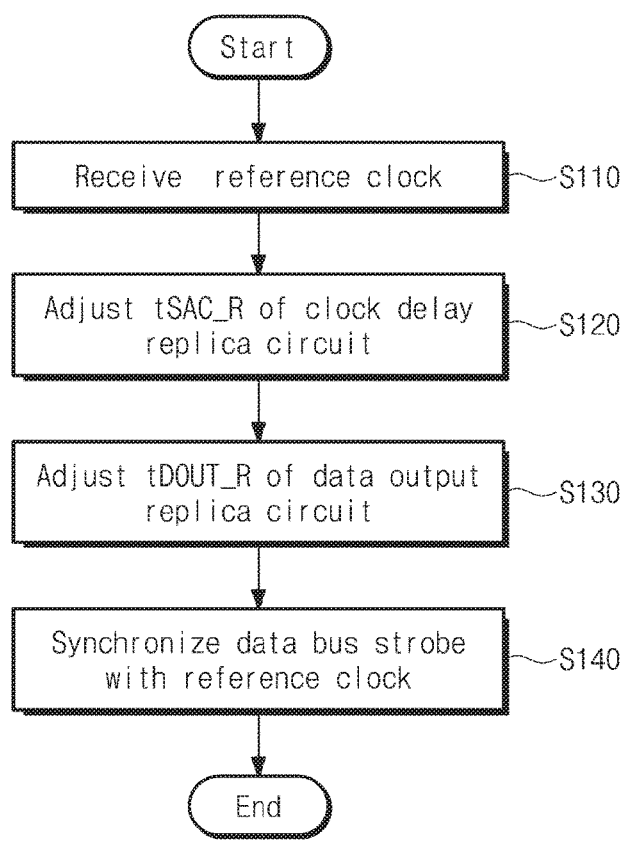
FIG. 10 is a flowchart illustrating an operation of a memory device according to some example embodiments of the inventive concepts.

FIG. 10 is a flowchart illustrating an operation of a memory device according to some example embodiments of the inventive concepts. FIG. 10 will be described with reference to FIG. 5.

In an operation S110, the delay locked loop 4100 may receive the reference clock (REF_CK). More specifically, the variable delay circuit 4110 of the delay locked loop 4100 may receive the reference clock (REF_CK).

In an operation S120, the delay locked loop 4100 may adjust a delay of the clock delay replica circuit 4120. An offset between the second clock CK2 and the third clock CK3 that occurs due to PVT variations may be removed in the operation S120.

In an operation S130, the delay locked loop 4100 may adjust a delay of the data output replica circuit 4130. An offset between the data strobe DQS and the fourth clock CK4 that occurs due to PVT variations may be removed in the operation S130.

In an operation S140, the delay locked loop 4100 may synchronize the data strobe DQS with the reference clock (REF_CK). Since the offsets due to a change of PVT in the operations S120 and S130 may be removed, the time tDQSCK and the time tDV may be improved.

The delay locked loop according to some example embodiments of the inventive concepts and the memory device including the delay locked loop can accurately replicate a clock route in a device that operates based on a clock. A phase of an output clock may be accurately locked to a phase of an input clock through the accurate operation of replicating the clock route described above.

While the present disclosure has been described with reference to some example embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A memory device comprising:
   a clock delay circuit configured to transmit a reference clock to a data output circuit; and
   a delay locked loop including a variable delay circuit and a clock delay replica circuit, the variable delay circuit configured to generate a first clock by delaying the reference clock, and the clock delay replica circuit configured to receive the first clock and replicate the clock delay circuit, the delay locked loop being configured to receive a second clock which is the delayed reference clock from the clock delay circuit, and adjust a delay of the clock delay replica circuit based on the second clock and a third clock output from the clock delay replica circuit.

2. The memory device of claim 1, wherein the delay locked loop comprises:
   a first phase detector configured to receive the second clock and the third clock, and to detect a phase difference between the second clock and the third clock; and
   a first controller configured to adjust the delay of the clock delay replica circuit based on an output from the first phase detector.

3. The memory device of claim 2, wherein the delay locked loop further comprises:
   a data output replica circuit that replicates the data output circuit, and is configured to receive the third clock.

4. The memory device of claim 3, wherein the delay locked loop further comprises:
   a second phase detector configured to receive the reference clock and a fourth clock and detect a phase difference between the reference clock and the fourth clock, the fourth clock being the third clock delayed by the data output replica circuit; and
   a second controller configured to adjust a delay of the variable delay circuit based on an output from the second phase detector.

5. The memory device of claim 4 further comprising:
   the data output circuit configured to output a data strobe signal synchronized with the reference clock based on a read command.

6. The memory device of claim 5, wherein the delay locked loop further comprises:
   a third phase detector configured to detect a phase difference between the data strobe signal and the fourth clock; and
   a third controller configured to adjust a delay of the data output replica circuit based on an output from the third phase detector.

7. The memory device of claim 6, wherein the first, second, and third controllers are configured to adjust the clock delay replica circuit, the variable delay circuit, and the data output replica circuit in digital manner, respectively.

8. The memory device of claim 6, wherein the first controller is configured to transmit a first locking signal to the second controller or the third controller, in response to a phase of the third clock being locked to a phase of the second clock, and
   wherein the third controller is configured to transmit a second locking signal to the first controller or the second controller, in response to a phase of the fourth clock being locked to a phase of the data strobe signal.

9. The memory device of claim 8
   wherein the second controller is configured to generate a third locking signal with reference to the first locking signal and the second locking signal in response to the phase of the fourth clock being locked to a phase of the reference clock and the data output circuit is configured to synchronize read data with the data strobe signal using the third locking signal.

10. A memory device comprising:
    a variable delay circuit configured to receive a reference clock signal and output a first delayed clock based on the reference clock signal and a first delay code, the first delay code indicating a delay in the variable delay circuit;
    a clock delay circuit configured to receive the first delayed clock and output a second delayed clock based on the first delayed clock;
    a data output circuit configured to receive the second delayed clock and output a data strobe signal based on the second delayed clock;
    a clock delay replica circuit configured to receive the first delayed clock and output a third delayed clock based on the first delayed clock and a second delay code, the second delay code indicating a delay in the clock delay replica circuit; and
a data output replica circuit configured to receive the third delayed clock and output a data strobe replica signal based on the third delayed clock.

11. The memory device of claim 10, further comprising:
a first controller configured to output the first delay code based on a phase difference between the reference clock signal and the data strobe replica signal.

12. The memory device of claim 11, further comprising:
a second controller configured to output the second delay code based on a phase difference between the second delayed clock and the third delayed clock.

13. The memory device of claim 12, further comprising:
a third controller configured to output a third delay code based on a phase difference between the data strobe signal and the data strobe replica signal, the third delay code indicating a delay in the data output replica circuit, wherein the data output replica circuit is further configured to output the data output replica circuit based on the third delayed clock.

14. The memory device of claim 13, wherein:
the first controller is further configured to output the first delay code based on a first lock signal and a second lock signal;
the second controller is further configured to,
    output the first lock signal based on the phase difference between the second delayed clock and the third delayed clock, and
    output the first delay code based on the second lock signal; and
the third controller is further configured to,
    output the second lock signal based on the phase difference between the data strobe signal and the data strobe replica signal, and
    output the third delay code based on the first lock signal.

\* \* \* \* \*